United States Patent
Duggirala et al.

(10) Patent No.: US 6,269,463 B1
(45) Date of Patent: Jul. 31, 2001

(54) METHOD AND SYSTEM FOR AUTOMATICALLY DETERMINING TRANSPARENCY BEHAVIOR OF NON-SCAN CELLS FOR COMBINATIONAL AUTOMATIC TEST PATTERN GENERATION

(75) Inventors: Suryanarayana Duggirala, San Jose; Harihara Ganesan, Sunnyvale; Cyrus Hay, San Carlos, all of CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/283,310

(22) Filed: Mar. 31, 1999

Related U.S. Application Data

(63) Continuation-in-part of application No. 09/184,518, filed on Nov. 2, 1998.

(51) Int. Cl.⁷ .............................. G06F 11/00; G01R 31/28
(52) U.S. Cl. ............................. 714/738; 714/726
(58) Field of Search .................... 714/738, 741, 714/742, 724, 726, 728, 729, 727, 32, 33; 703/13, 14, 15, 21, 22

(56) References Cited

U.S. PATENT DOCUMENTS

| | | | |
|---|---|---|---|
| 5,329,533 | * 7/1994 | Lin .................................... | 714/727 |
| 5,638,380 | * 6/1997 | De ..................................... | 714/726 |
| 5,703,789 | * 12/1997 | Beausang et al. ................ | 364/489 |
| 5,831,868 | * 11/1998 | Beausang et al. ................ | 364/489 |

* cited by examiner

*Primary Examiner*—Christine T. Tu
(74) *Attorney, Agent, or Firm*—Wagner, Murabito & Hao LLP

(57) ABSTRACT

A method and system for generating test vectors for testing scan-based sequential circuits that contain non-scan cells using combinational ATPG techniques. The present invention includes the computer implemented step of receiving a netlist description of an integrated circuit device that comprises scan cells and non-scannable cells. Under certain conditions, some non-scan cells may exhibit sequential transparency behavior. The present invention identifies such conditions and characterizes each non-scan cell as sequentially transparent or non-transparent. Based on such characterization, the present invention transforms non-scan cells exhibiting sequential transparency behavior with transparent logic models during combinational ATPG (Automatic Test Pattern Generation) analysis. Because non-scan cells of exhibiting sequential transparency behavior are not replaced with "force-to-X" models, the fault coverage of the test patterns thus generated is significantly improved.

21 Claims, 14 Drawing Sheets

METHOD AND SYSTEM FOR AUTOMATICALLY DETERMINING TRANSPARENCY BEHAVIOR OF NON-SCAN CELLS FOR COMBINATIONAL AUTOMATIC TEST PATTERN GENERATION

RELATED U.S. APPLICATION

The instant application is a continuation-in-part of co-pending U.S. patent application Ser. No. 09/184,518 filed on Nov. 2, 1998, and entitled "A Method and System for Transforming Scan-Based Sequential Circuits With Multiple Skewed Capture Events into Combinational Circuits for More Efficient Automatic Test Pattern Generation," by Ruiz et al., and assigned to the assignee of the present invention.

FIELD OF THE INVENTION

The field of the present invention pertains to the field of automatic test pattern generation for use with electronic design automation tools. More particularly, aspects of the present invention pertain to testability analysis and test methodology analysis for use in the design of complex integrated circuits with computer aided design (CAD) tools.

BACKGROUND OF THE INVENTION

The rapid growth of the complexity of modern electronic circuits has forced electronic circuit designers to rely upon computer programs to assist and automate most steps of the circuit design process. Typical modern circuits contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system that designers use for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated by the EDA system into a lower level technology-specific netlist based on a technology-specific library that has gate-specific models for timing and power estimation. A netlist describes the IC design and is composed of nodes (elements) and edges, e.g., connections between nodes, and can be represented using a graph structure having nodes which are connected to each other with signal lines. The netlist is typically stored in computer readable media within the EDA system and processed and verified using many well known techniques. The netlist is then used to generate a physical device layout in mask form which can be used to directly implement structures in silicon to realize the physical IC device.

As ASICs and other complex integrated circuits have become more complex and more dense, they have become progressively harder to test for manufacturing defects. With current technology, as the number of gates and transistors increase, the time which an ASIC spends in testing increases as well. This increase incurs an additional cost on ASIC manufacturing. The testing cost can be very significant for the latest and largest ASIC designs. In addition, as more complex systems-on-a-chip devices proliferate, which integrate complex logic units (e.g., integer units, floating point units, memory, etc.) into a single chip, and as newly-designed processors begin to take advantage of the ability to integrate large quantities of memory on-chip, it has become necessary to increase the comprehensiveness, efficiency, and accuracy of the design checking and testing schemes utilized to ensure proper operation of these devices (e.g., ASICs, complex integrated circuits, field programmable gate arrays, etc.).

Thus, an increasingly important part of the logic synthesis and testing process involves designing ASICs and other complex integrated circuits for inherent testability. Programs that aid in the testability process of logic synthesis are called design for test (DFT) processes. As part of DFT, it is well known to take the mapped netlist generated from a compiler and add and/or replace certain memory cells and associated circuitry with special memory cells that are designed to allow the application of test vectors to certain logic portions of the integrated circuit. The act of applying test vectors is called stimulation of the design, and the special memory cells and associated circuitry are referred to as DFT implementations. The same memory cells can be used to capture the output of the circuitry for observation and compare this output to the expected output in an effort to determine if circuit (e.g., manufacturing) defects are present. Issues concerning controllability deal with facilitating the application of the test vectors to the circuitry to be tested. On the other hand, issues concerning observability deal with facilitating the capturing the output of the circuitry.

The portions of an integrated circuit that are designed to perform its intended or expected operational function are called its "mission mode" circuitry, while the portions added to the integrated circuit to facilitate testability are called "test mode" circuitry or DFT implementations. The resultant circuit, therefore, has two functional modes, mission and test.

An exemplary flow chart diagram of a typical design automation process 100, including a DFT process, is shown in FIG. 1. The process 100 described with respect to this flow chart is implemented within a computer system in a CAD environment. Within the process 100, a circuit designer first generates a high-level description 105 of a circuit in a hardware description language such as VHDL or Verilog. The high-level description 105 is then converted into a netlist 115 by using a computer implemented synthesis process 110 such as the "Design Compiler" available from Synopsys, Inc., of Mountain View, Calif. A netlist 115 is a description of the electronic circuit which specifies what cells compose the circuit and which pins of which cells are to be connected together using interconnects ("nets"). At this point the netlist 115 consists of "mission mode" circuitry.

At block 120, a constraint-driven scan insertion process is performed to implement testability cells or "test mode" cells into the overall integrated circuit design. In this process 120, memory cells of the netlist 115 are replaced with scannable memory cells that are specially designed to apply and observe test vectors or patterns to and from portions of the integrated circuit. In addition, process 120 performs linking groups of scannable memory cells ("scan cells") into scan chains so that the test vectors can be cycled into and out of the integrated circuit design. The output of the scan insertion process 120 is a scannable netlist 125 that contains both "mission mode" and "test mode" circuitry.

Test vectors for testing the integrated circuit can be derived from combinational or sequential automatic test pattern generation (ATPG) processes depending on the parameters, interconnections, etc., of the scannable netlist 125. Thus, at block 130, a specific procedure known as combinational ATPG "design rule checking" (DRC) is applied to determine whether combinational ATPG tools properly understand and interpret the parameters, interconnections, etc. of the scanned netlist 125. Combinational ATPG DRC 130 is very restrictive with regard to the parameters, formats, etc., of the scannable netlist 125. For instance, prior art combinational ATPG design rule checkers rejected netlists which contained multiple capture events. Netlists containing non-scan cells were also rejected by prior art combinational ATPG design rule checkers. Such netlists could not be properly processed by prior art combinational ATPG compilers.

If the scannable netlist 125 meets the requirements of combinational ATPG DRC 130, the scanned netlist 125 is passed to block 140 for combinational ATPG processing. The result of this combinational ATPG processing 140 is a test program 145 adapted for application to automatic test equipment (ATE) 160. If scannable netlist 125 does not pass combinational ATPG DRC at block 130, a less restrictive procedure known as sequential ATPG processing 150 is applied in place of combinational ATPG processing 140. However, sequential ATPG processing 150 has a disadvantage in that it is far more complex, expensive and time consuming than combinational ATPG processing 140.

One way to avoid sequential ATPG processing 150 is to repeat scan insertion process 120 using different test constraints to generate a new scannable netlist. The new netlist is then processed for combinational ATPG DRC 130. If combinational ATPG DRC 130 is passed, combinational ATPG processing 140 is applied. If not, the scan insertion process 120 may have to be repeated again. This approach is also disadvantageous because each modification requires new, time-consuming, compile processes. The additional compile processes delay the overall integrated circuit synthesis process by as much as one to two weeks. Even after this long delay, there are no guarantees that the additional compiles will generate a scannable netlist satisfying combinational ATPG DRC in step 130.

Another way to avoid sequential ATPG processing 150 is to relax the constraints of the combinational ATPG DRC 130 to receive netlists containing multiple skewed events and non-scan cells. In those cases, scan cells are transformed into equivalent combinational circuit models based on their respective observability and controllability during combinational ATPG processing 140. In addition, non-scan cells of the scannable netlist 125 are replaced with "force-to-X" logic models. That is, the outputs of the non-scan cells are presumed to be "X" or "don't care" regardless their actual logic states. This approach is significantly faster and more efficient than sequential ATPG processing 150, and is particularly effective in "almost full-scan" designs (e.g., designs having 99% scan cells and 1% non-scan cells). However, as non-scan cells are replaced with "force-to-X" logic models, fault coverage of the test patterns thus generated would be significantly compromised.

Thus, what is needed is a method and system for testing scan based sequential circuits that contain non-scan cells using combinational ATPG techniques. Additionally, what is further needed is a method and system for providing increased fault coverage for test vectors generated by combinational ATPG. The present invention provides these advantages.

SUMMARY OF THE INVENTION

Accordingly, the present invention provides a method and system for testing scan based sequential circuits that contain non-scan cells using combinational ATPG (Automatic Test Pattern Generation) techniques. The present invention further provides a method and system for providing increased fault coverage for test vectors generated by combinational ATPG. These and others advantages of the present invention not specifically mentioned above will become clear within discussions presented herein.

In one embodiment, the present invention includes the computer implemented step of receiving a netlist description of an integrated circuit design that comprises scan cells and non-scan cells. Under certain conditions, some non-scan cells may exhibit sequential transparency behavior. The present invention performs a sequential transparency analysis on the netlist description to characterize each non-scan cell as sequentially transparent or non-transparent, and generates characterization data indicative thereof. Based on the characterization data, the present invention replaces non-scan cells exhibiting sequential transparency behavior with transparent logic models during pattern generation. The fault coverage of the test vectors thus generated is significantly improved because non-scan cells exhibiting sequential transparency behavior are not replaced with "force-to-X" logic models.

According to the present invention, the configuration of the non-scan cell in relation to the scan cells and ordering of the capture events are used to determine the sequential transparency of the non-scan cells. For a non-scan cell whose input is driven by one or more scan cells and whose output drives one or more scan cells, it is characterized as sequentially transparent if the driving scan cells capture earlier than the non-scan cell, and if the driven scan cells capture later than the non-scan cell, within the same capture cycle. The non-scan cell is also characterized as sequentially transparent if the driving scan cells and the driven scan cells capture later than the non-scan cell, and if the driving scan cells capture at the same time as the driven scan cells, within the same capture cycle. Further, a non-scan cell is characterized as sequentially transparent if the driving scan cells and the driven scan cells capture later than the non-scan cell and if the driving scan cells capture at a later time than the driven scan cells, within the same capture cycle.

For a non-scan cell which is not driven by any scan cells, it is characterized as sequentially transparent if the driven scan cells capture later than the non-scan cell within the same capture cycle. For a non-scan cell which does not drive any scan cells, it is characterized as sequentially transparent if the driving scan cells capture before the non-scan cell within the same capture cycle. For a non-scan cell that is driven by another non-scan cell, it is characterized as sequentially transparent if the other non-scan cell captures earlier and if the non-scan cells capture later than the driving scan cells and earlier than the driven scan cells within the same capture cycle.

According to the present invention, non-scan cell characterization data is provided to an automatic test pattern generation process for generating test vectors for the integrated circuit design. The pattern generation process, based on the non-scan cell characterization data, replaces the non-scan cells exhibiting sequential transparency with corresponding transparent logic models. Fault coverage of the test vectors thus generated are increased because non-scan cells exhibiting sequential transparency are replaced with transparent logic models instead of "force-to-X" logic models. In this manner, the test vectors generated will increase fault coverage of the circuit.

Embodiments of the present invention include the above and further include an electronic design automation (EDA)

system comprising: a computer system including a processor coupled to a computer readable memory via a bus. The computer readable memory contains computer readable software which, when executed by the computer system, causes the computer system to implement a method for generating a test program for an integrated circuit design. The method includes the computer implemented steps of: receiving a HDL description of the integrated circuit design in a computer memory unit of the electronic design automation system; compiling the HDL description with a compiler to produce a scan-based sequential netlist description, wherein the sequential netlist description comprises functional logic blocks and connections there between including scan cells, non-scan cells and combination logic; processing the sequential netlist description using an automatic test pattern generation (ATPG) program. The step of processing further comprises the step of: (a) identifying the scan cells and the non-scan cells included in the sequential netlist description; (b) performing sequential transparency analysis on the sequential netlist description and generating characterization data indicative of the sequential transparency behaviors of the non-scan cells; and (c) based on the characterization data, compiling the sequential netlist description into an optimized netlist by using an ATPG compiler, wherein the non-scan cells exhibiting sequential transparency behavior are replaced with transparency behaviors during the step (c); and (d) executing a pattern generation program to process the non-scan optimized netlist to generate test vectors for testing the integrated circuit design.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

I. Computer System Platform

Figure 1:
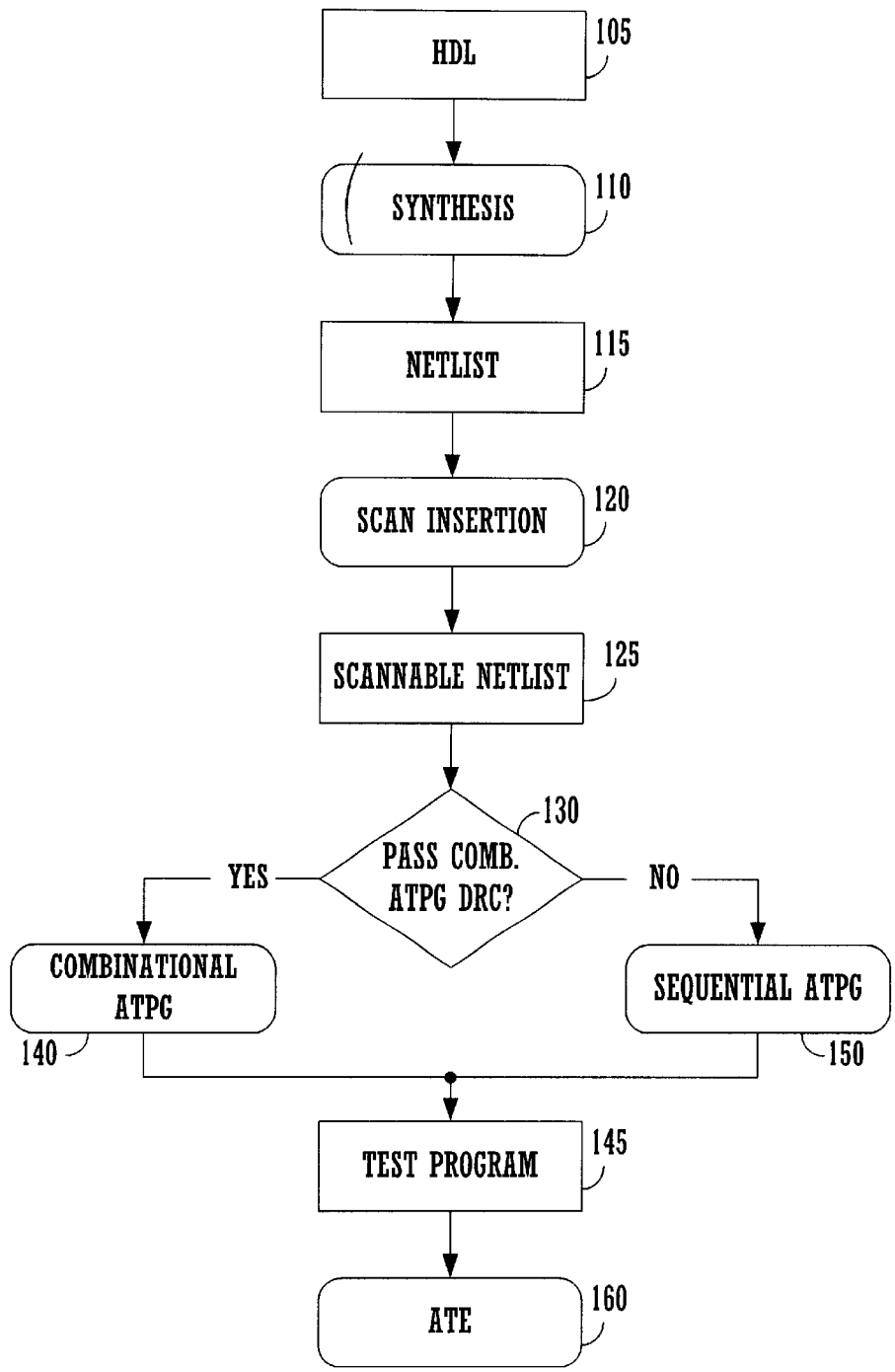
FIG. 1 shows an exemplary flowchart diagram of a typical prior art process for generating a test program for testing an integrated circuit design.
Figure 2:
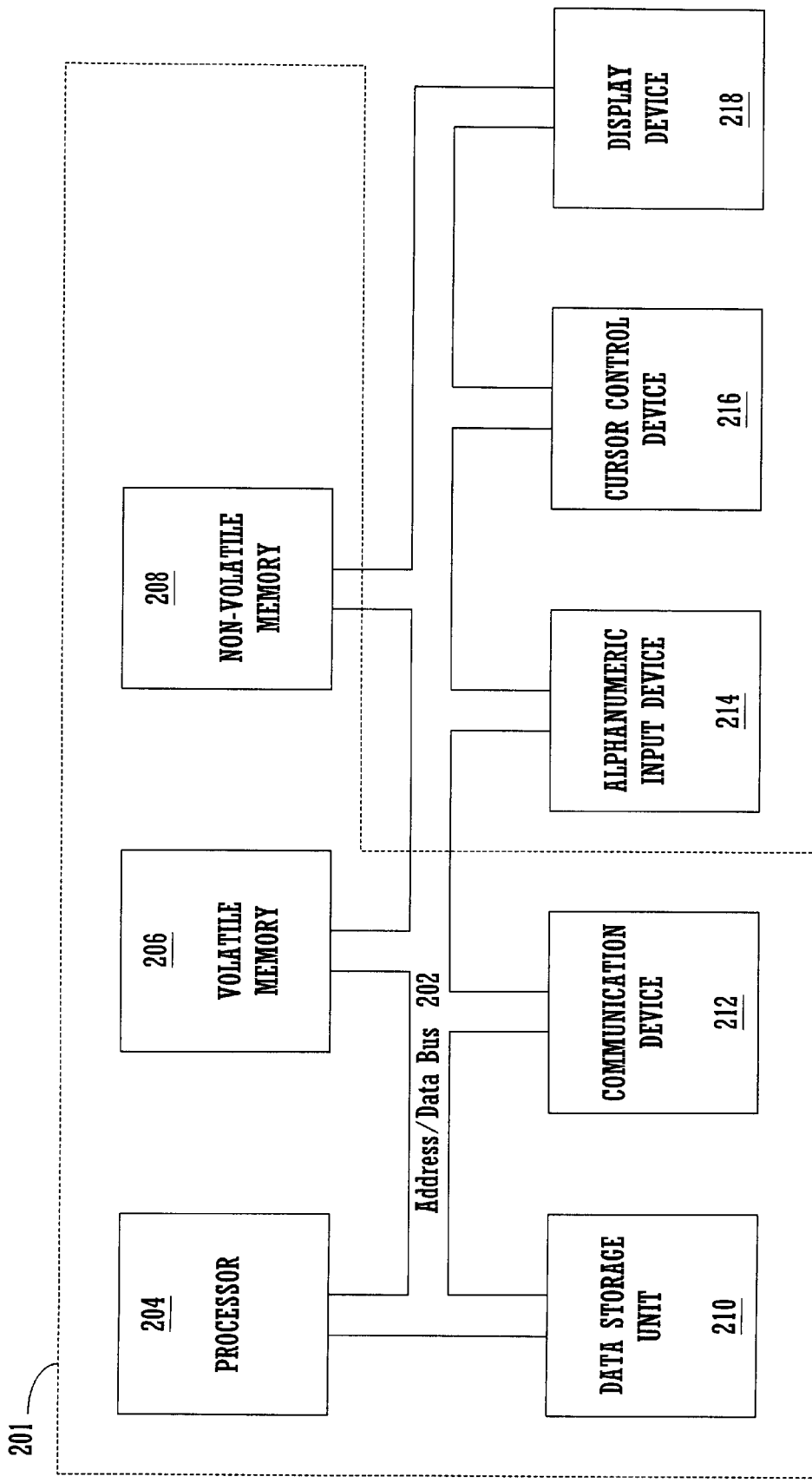
FIG. 2 is a computer-aided design (CAD) system including a computer system operable as a platform on which embodiments of the present invention may be implemented.

Specific aspects of the present invention are operable within a programmed computer aided design (CAD) system. A CAD system operable as a platform to implement and support elements of the present invention is shown in FIG. 2. In general, the CAD system of the present invention includes a general purpose computer system 201 which includes an address/data bus 202 for communicating information including address, data, and control signals, a central processor 204 coupled with bus 202 for processing information and instructions, a volatile memory 206 (e.g., random access memory RAM) coupled with the bus 202 for storing information and instructions for the central processor 204 and a non-volatile memory 208 (e.g., read only memory ROM) coupled with the bus 202 for storing static information and instructions for the processor 204, a data storage device 210 such as a magnetic or optical disk and disk drive coupled with the bus 202 for storing information and instructions, an optional display device 218 coupled to the bus 202 for displaying information to the computer user, an optional alphanumeric input device 214 including alphanumeric and function keys coupled to the bus 202 for communicating information and command selections to the central processor 204, an optional cursor control or directing device 216 coupled to the bus 202 for communicating user input information and command selections to the central processor 204, and a communication device 212 coupled to the bus 202 for communicating signals that are input and output from the system 201.

Program instructions executed by the CAD system can be stored in computer usable memory units such as RAM 206, ROM 208, or in the storage device 210, and when executed in a group can be referred to as logic blocks, steps or procedures. It is appreciated that data produced at the various logic synthesis stages of the present invention, including representations of the different levels of abstraction of the integrated circuit design, such as a netlist and or non-scan cell characterization data, can also be stored in RAM 206, ROM 208 or the storage device 210 as shown in FIG. 2.

The display device 218 of FIG. 2 utilized with the computer system 201 of the present invention is optional and may be a liquid crystal device, cathode ray tube, or other display device suitable for creating graphic images and alphanumeric characters recognizable to the user. The cursor control device 216 allows the computer user to dynamically signal the two dimensional movement of a visible pointer on a display screen of the display device 218. Many implementations of the cursor control device are known in the art including a trackball, mouse, joystick or special keys on the alphanumeric input device 214 capable of signaling movement of a given direction or manner of displacement.

II. Notation and Nomemclature

Some portions of the detailed descriptions which follow are presented in terms of procedures, steps, logic blocks, processing, and other symbolic representations of operations on data bits within a computer memory (e.g., volatile memory 206). These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "determining", "generating", "associating", "assigning" or the like, refer to the actions and processes of a computer system, or similar electronic computing device (e.g., computer system 201 of FIG. 2). The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

II. Characterization of Non-Scan Cells for Combinational ATPG According to the Present Invention As described above, the present invention provides a method and system for automatically determining transparent behavior of non-scan cells in scan-based sequential circuits for facilitating the application of combinational ATPG (automatic test pattern generation) techniques. The present invention further provides a method and system for providing increased fault coverage for test vectors generated by combinational ATPG. The aforementioned goals and other advantages of the present invention are achieved by transforming non-scan memory cells exhibiting sequential transparency behavior into transparent logic models during combinational ATPG processing. The process of one embodiment of the present invention is diagrammed in FIG. 3 below.

Figure 3:
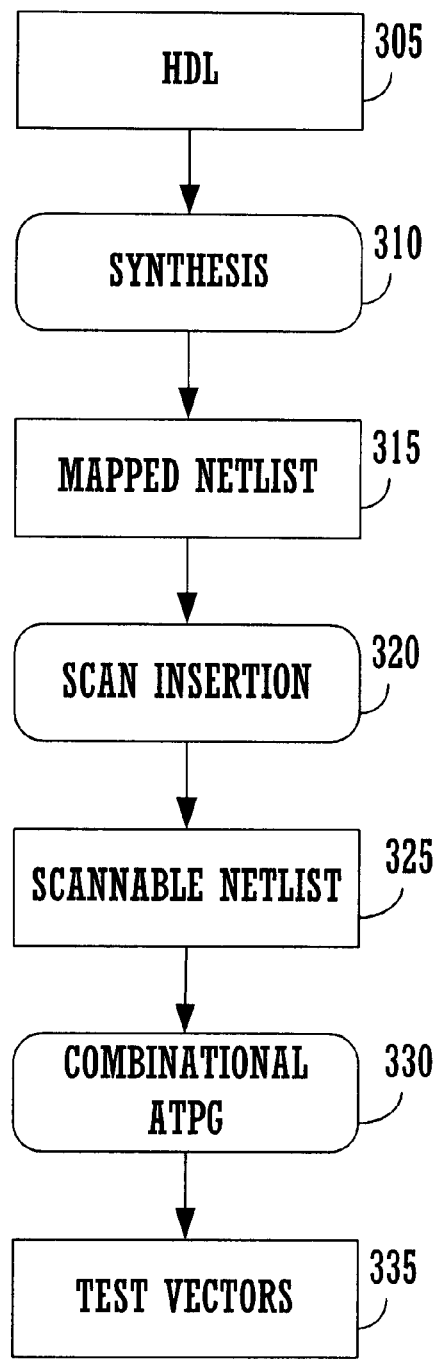
FIG. 3 shows a diagram of a test program generation process in accordance with one embodiment of the present invention.

FIG. 3 is a flow diagram of a process 300 in accordance with an embodiment of the present invention and its logic blocks are implemented as instructions executed within the computer controlled CAD system 201 described above. As illustrated, an HDL description 305 of an integrated circuit (IC) design is input into a synthesis process block 310. Synthesis process block 310 may include well known procedures such as HDL compiling procedures, logic optimization procedures, and mapping procedures. Synthesis block 310 ultimately generates a gate level mapped netlist 315 that has cells specifically selected in accordance with the particular manufacturing technology being used to fabricate the IC device.

At block 320, a scan-insertion process (also called test insertion) is performed for implementing testability cells or "test mode" cells into the overall integrated circuit design. At block 320, memory cells of the design are replaced with scannable memory cells ("scan cells") and other logic that are specially designed to apply and observe test vectors or patterns to and from portions of the integrated circuit. In one particular DFT process, these scannable memory cells specially designed for test are called scan cells. Scan-insertion processes of block 310 also perform linking groups of scan cells into respective scan chains so that the test vectors can be cycled into and out of the integrated circuit design. The output of the scan insertion processes is a scannable netlist 320 that contains both mission mode and test mode circuitry.

It should be appreciated that not all memory cells can be scan cells for a variety of reasons. Some memory cells do not offer a scan-in ability or do not offer a scan-out ability due to logic considerations. Further, some cells cannot capture data at their data-in port. Also, some memory cells directly control the reset, clock or input line of another memory cell in a scan chain. In this case, when a test vector is loaded into the scan chain, portions of the test vector can be altered. Lastly, some memory cells, after the scan chain is constructed, do not offer scannability for various logic reasons, e.g., clock skews, etc. These memory cells that do not support scanning are referred herein as non-scannable cells or non-scan cells.

The scannable netlist 325 of FIG. 3 is subsequently passed to a combinational ATPG process 330 of the present invention. The outputs of the combinational ATPG process 330 are test vectors 335 for use in testing the integrated circuit design.

It should be appreciated that the functionality of the present invention is largely implemented through the operations of the combinational ATPG process 330. The combinational ATPG process 330 of the present invention checks for sequential transparency behavior of the non-scan cells, and transforms those cells which exhibit sequential transparency characteristics into transparent logic models for pattern generation. By transforming appropriate non-scan cells into transparent logic models, fault coverage of the test vectors thus generated is significantly improved. Steps of the combinational ATPG process 330 are discussed below.

Figure 4:
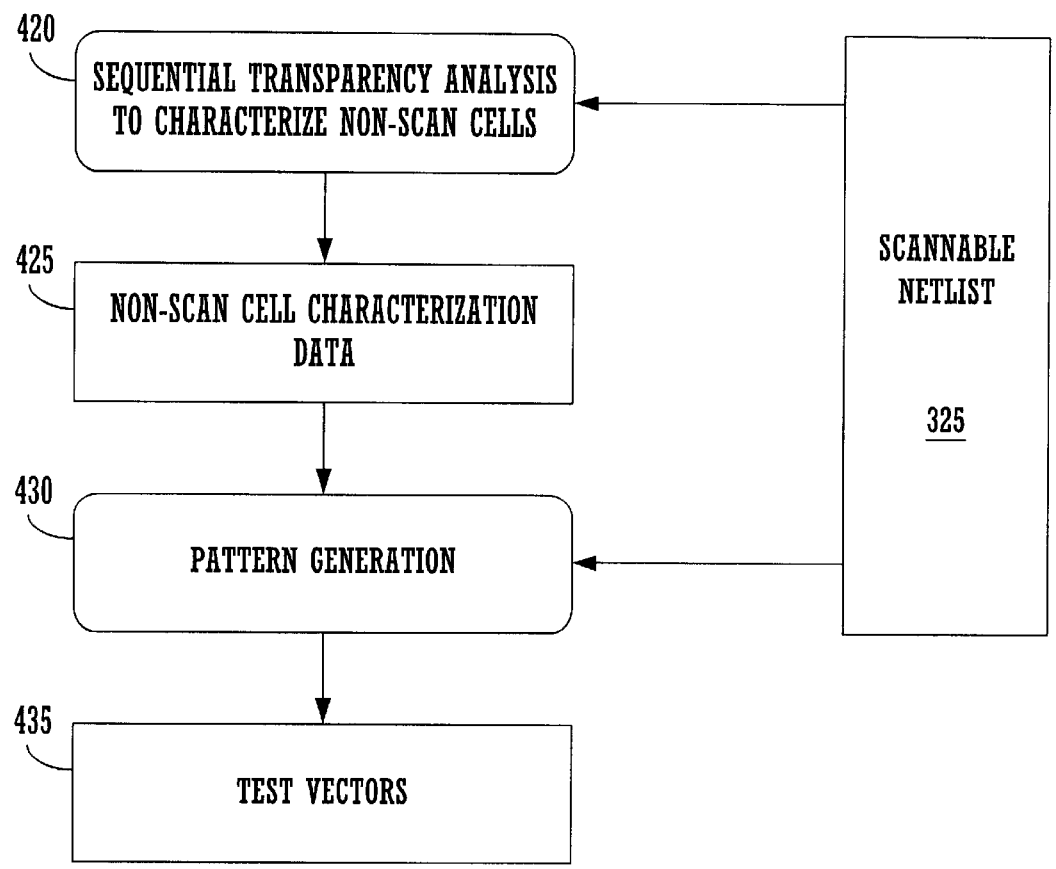
FIG. 4 shows the steps of the automatic test pattern generation process of FIG. 3 in accordance with one embodiment of present invention.

FIG. 4 illustrates steps of combinational ATPG process 330 of FIG. 3 in accordance with one embodiment of the present invention. It should be appreciated that many well known steps of the combinational ATPG process 330, such as design rule checking and ATPG compile, are not shown in FIG. 3 in order to avoid obscuring aspects of the present invention.

As illustrated in FIG. 4, a sequential transparency analysis process 420 receives the scannable netlist 325 as its input. For illustration, it is assumed that scannable netlist 325 includes a number of non-scan cells in addition to a number of scan cells. Significantly, sequential transparency analysis process 420 examines each of the non-scan cells of the netlist 325, and determines whether each of the non-scan cells exhibits sequential transparency behavior. According to the present invention, under certain circumstances, some nonscan cells may appear "transparent" to combinational ATPG process 330. For example, if a non-scan cell is coupled between a driving scan cell and a driven scan cell, the non-scan cell may appear transparent to the combinational ATPG process 330 if the non-scan cell captures after the driving scan cell but before the driven scan cell. The sequential transparency analysis process 420 of the present invention identifies such circumstances and characterizes each non-scan cell as either sequentially transparent or non-transparent. The output of the sequential transparency analysis process 420 includes non-scan cell characterization data 425. Some exemplary circumstances under which non-scan cells appear "transparent" to the combinational ATPG process 330 are described in greater detail below.

With reference still to FIG. 4, an pattern generation process 430 is applied to the netlist 325. Pattern generation process 430 transforms the circuit specified by the netlist 325 into an equivalent combinational model during simulation. Additionally, according to the present invention, pattern generation process 430 replaces non-scan cells with corresponding combinational logic models based on the non-scan cell characterization data 425. Particularly, non-scan cells characterized as sequentially transparent are replaced with transparent logic models (e.g., buffers) during the pattern generation process. Non-scan cells characterized as sequentially non-transparent are replaced with "force-to-X" logic models.

It should be appreciated that, in prior art combinational ATPG processes, all non-scan cells were replaced with "force-to-X" logic models during pattern generation. Because the logic states of the nets driven by the "force-to-X" logic models were indeterministic, the test vectors thus generated were not able to test for faults at those nets and other associated cells. Therefore, prior art combinational ATPG processes were only able to achieve low fault coverage when non-scan memory cells were present. The present invention provides a solution for the aforementioned problem by transforming non-scan cells exhibiting sequential transparent behavior into transparent logic models (e.g., buffers) during simulation. In this manner, the logic states of the nets driven by such non-scan cells are controllable by test vectors. Accordingly, the fault coverage of the test vectors thus generated is significantly improved.

Referring again to FIG. 4, pattern generation process 430, guided by the characterization data 425, runs a simulation of the integrated circuit as described by the netlist 325 using transparent logic models when appropriate, and determines test vectors 435 therefrom.

IV. Exemplary Configurations of Non-Scan Cells Exhibiting Sequential Transparency Behavior According to the present invention, some non-scan cell appear "transparent" to the combinational ATPG process 330 under certain conditions. For example, if a non-scan cell is coupled between a driving scan cell and a driven scan cell, the non-scan cell may appear transparent to the combinational ATPG process 330 if the non-scan cell captures after the driving scan cell but before the driven scan cell within the same capture cycle. The sequential transparency analysis process 420 of the present invention examines the configurations and clocking schemes of the non-scan cells in relation to the scan cells to identify non-scan cells that meet those conditions. This process is herein referred to as "characterization."

In accordance with present invention, the sequential transparency analysis process 420 first determines the positions of the non-scan cells with respect to the scan cells. For simplicity, the scan cells that are coupled to the input of a non-scan cell either directly or through combinational logic are referred to herein as driving scan cells. The scan cells that are coupled to the output of a non-scan cell either directly or through combinational logic are referred to herein as driven scan cells. The sequential transparency analysis process 420 then determines the ordering of the capture events of the non-scan cells in relation to the capture events of the driving scan cells and the driven scan cells. According to the present invention, sequential transparency behavior in the non-scan cells can be determined based on the positions of the non-scan cells and their respective capture event ordering.

Figure 5:
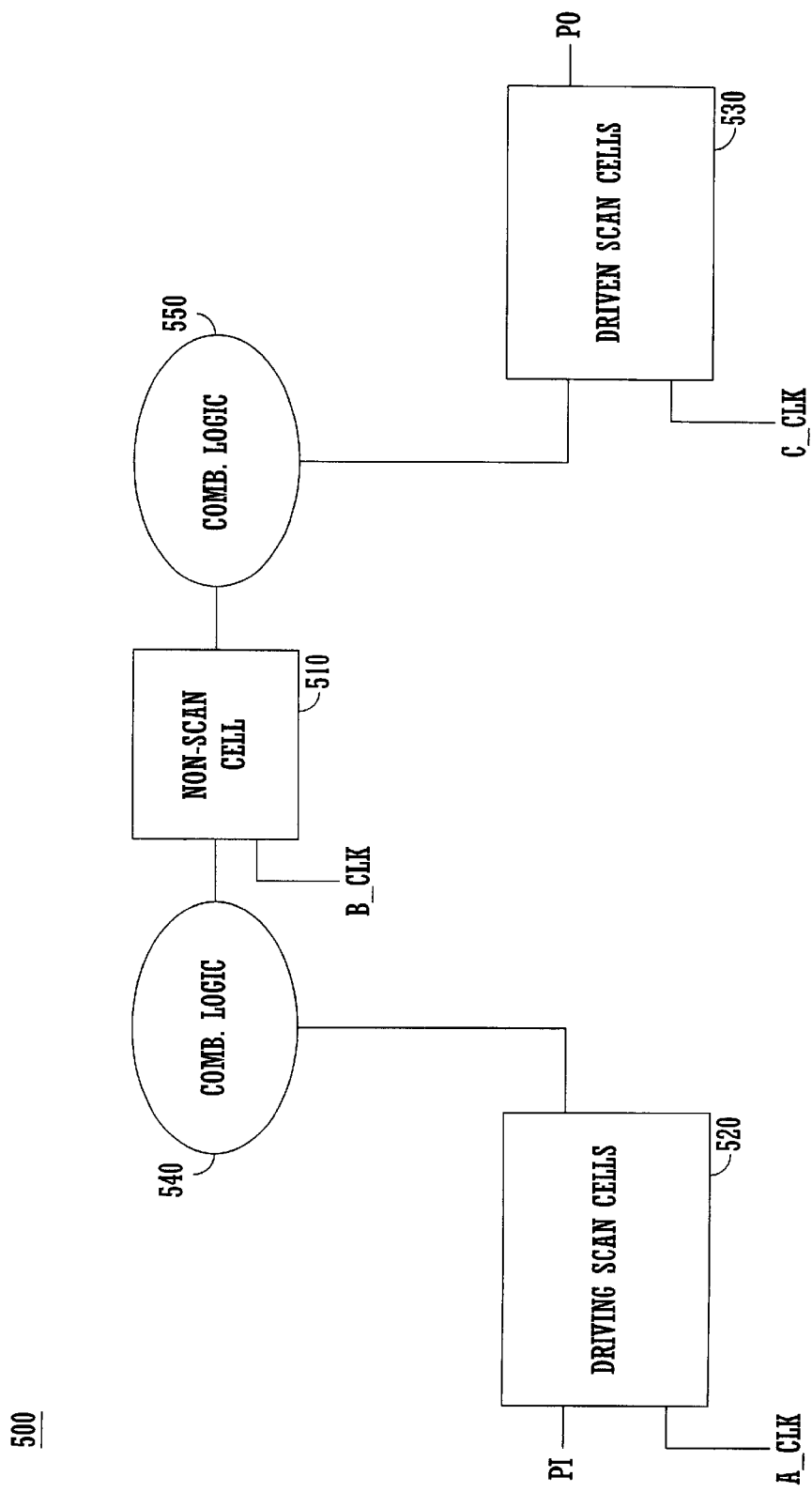
FIG. 5 is a block diagram illustrating an exemplary circuit including a non-scan cell and its corresponding driving scan cells and driven scan cells according one embodiment of the present invention.

FIG. 5 illustrates an exemplary circuit 500 including a non-scan cell 510 that may be characterized as sequentially transparent in accordance with one embodiment of the present invention. As illustrated, circuit 500 includes a number of driving scan cells 520 coupled to the input of the non-scan cell 510 via combinational logic circuit 540. Circuit 500 also includes a number of driven scan cells 530 coupled to the output of non-scan cell 510 via combinational logic circuit 550. Driving scan cells 520 are coupled to receive primary input (PI) and driven scan cells 530 are coupled to primary output (PO). In the present example, driving scan cells 520 are coupled to receive a clock input A_CLK, non-scan cell 510 is coupled to receive a clock input B_CLK and driven scan cells 530 are coupled to receive a clock input C_CLK. It should be noted that the combinational logic circuit 540 is coupled to the outputs of driving scan cells 520 and that the combinational circuit 550 is coupled to the inputs of the driven scan cells 530.

Figure 6A:
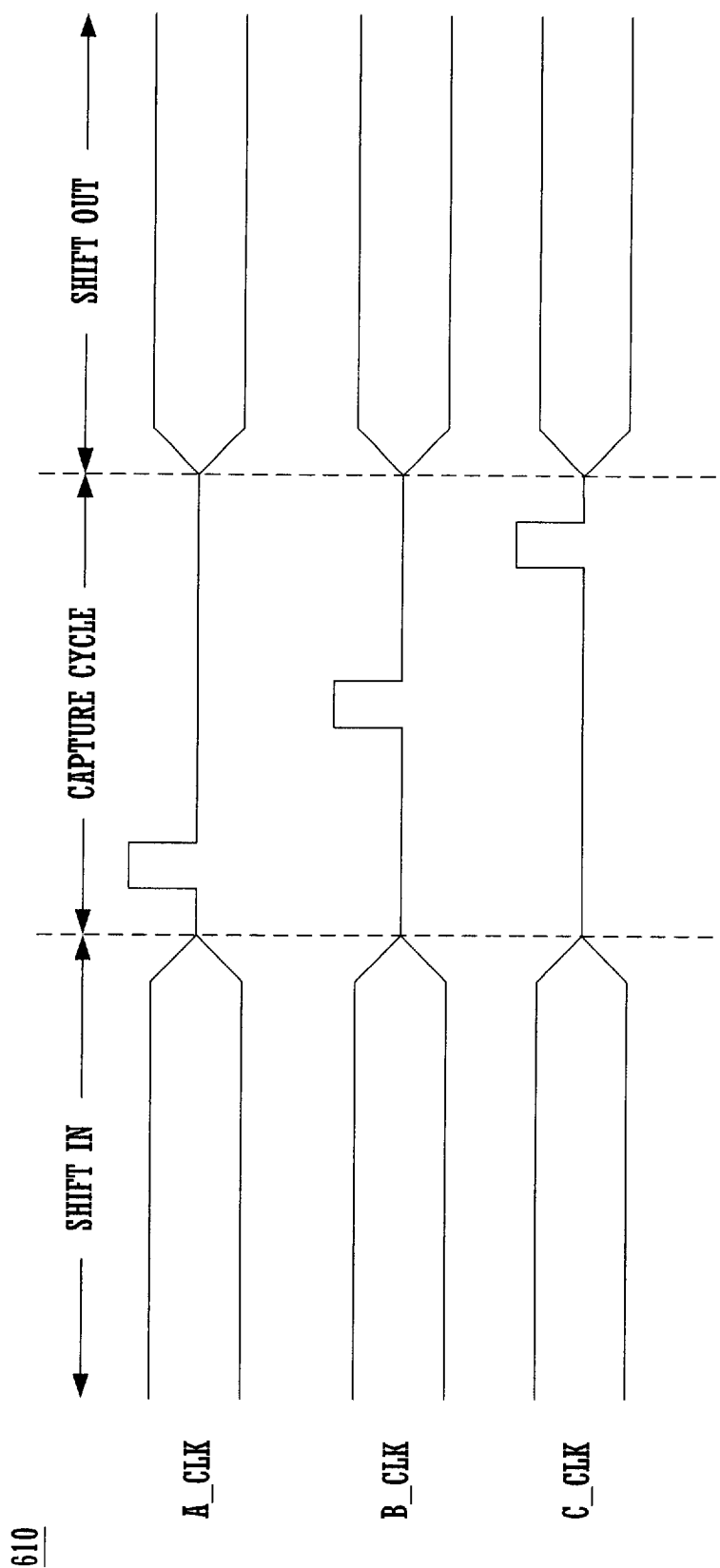
FIG. 6A shows a timing diagram depiction of a capture cycle in accordance with one embodiment of present invention.

According to the present invention, non-scan cell 510 exhibits sequential transparency behavior under one of the following conditions:

1. The first condition is that the driving scan cells 520 capture before non-scan cell 510 and the driven scan cells 530 capture after non-scan cell 510 within the same capture cycle. A timing diagram depiction 610 in accordance with this embodiment is illustrated in FIG. 6A.

Figure 6B:
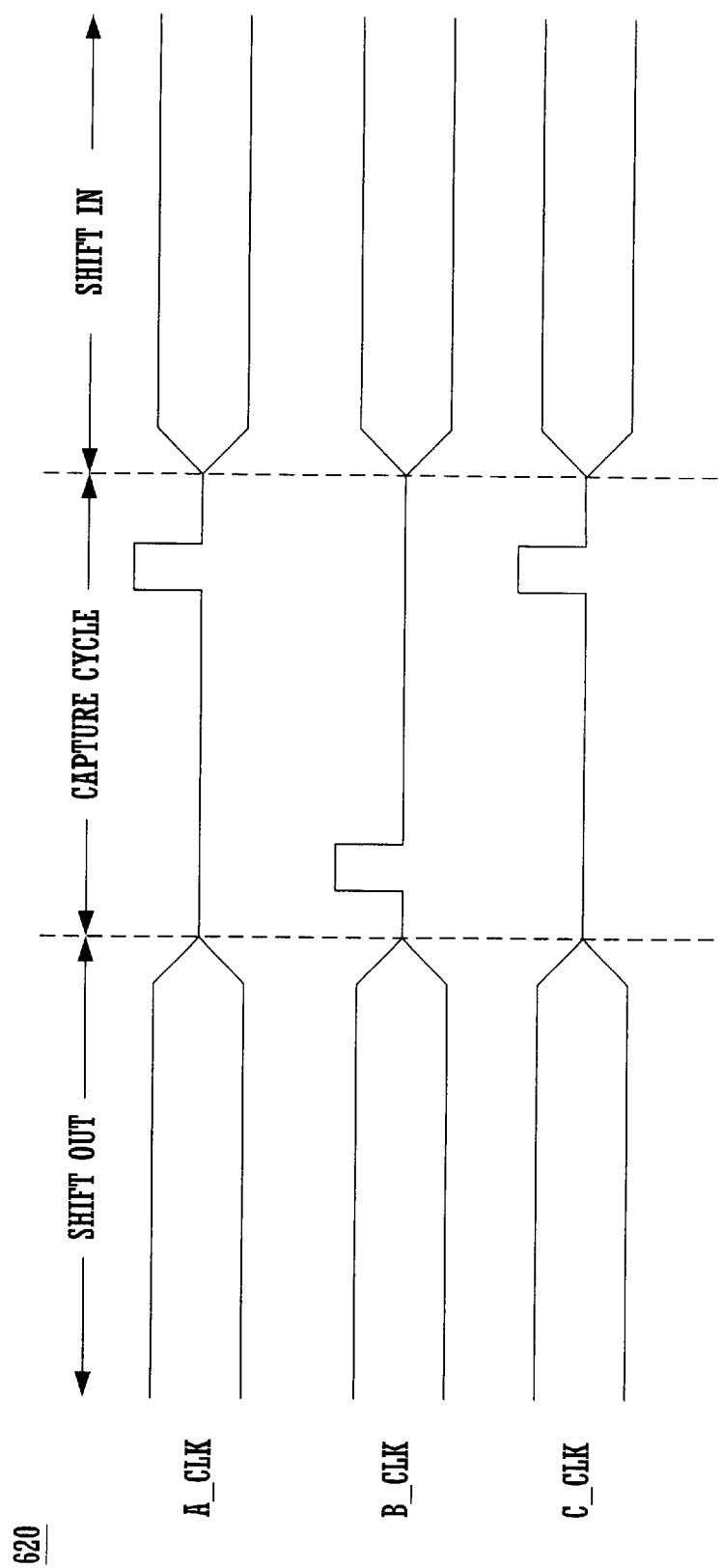
FIG. 6B shows a timing diagram depiction of a capture cycle in accordance with one embodiment of present invention.

2. The second condition is that the non-scan cell 510 captures before the driving scan cells 520 and the driven scan cells 530 within the same capture cycle. In addition, the driving scan cells 520 and the driven scan cells 530 capture at the same time. A timing diagram depiction 620 in accordance with this embodiment is illustrated in FIG. 6B.

Figure 6C:
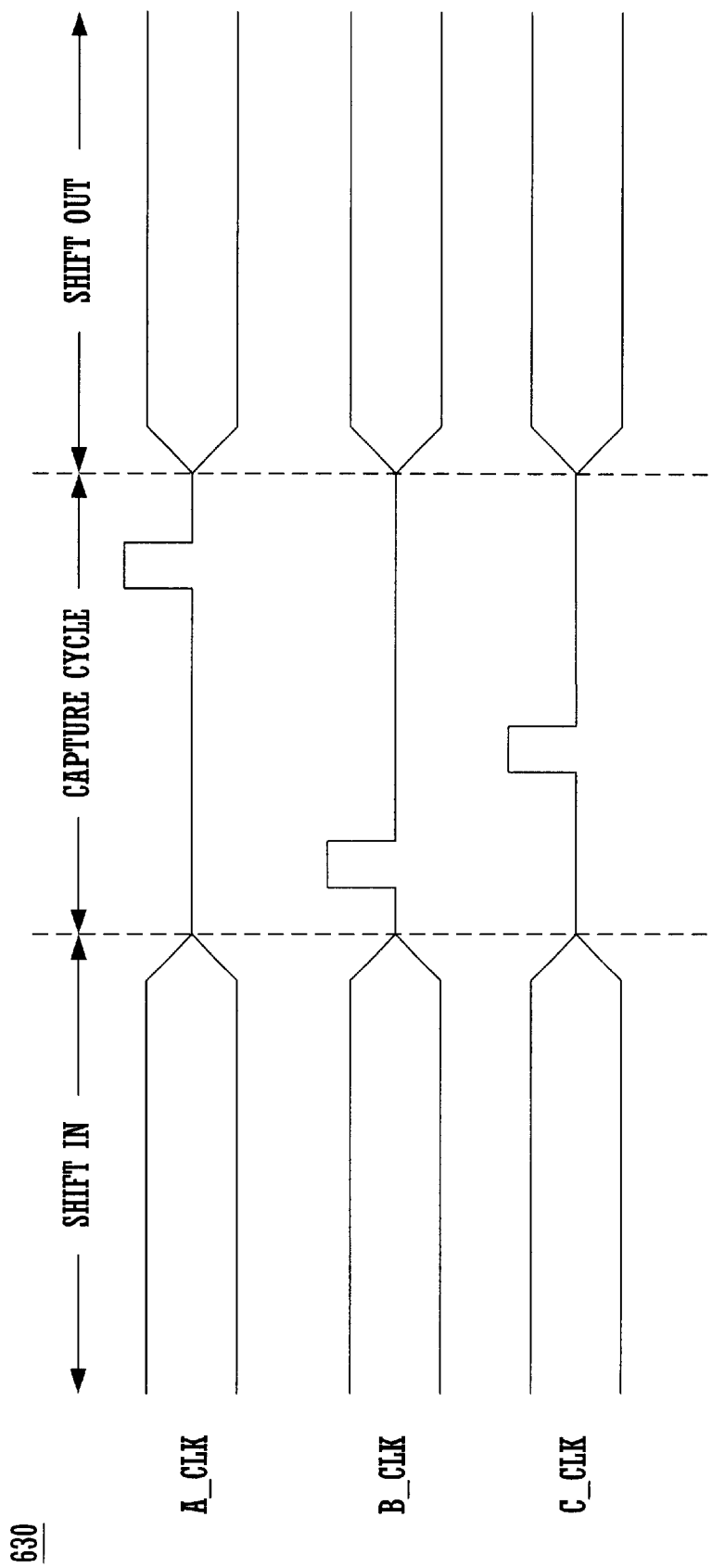
FIG. 6C shows a timing diagram depiction of a capture cycle in accordance with one embodiment of present invention.

3. The third condition is that the non-scan cell 510 captures before the driving scan cells 520 and the driven scan cells 530 within the same capture cycle. In addition, the driven scan cells 530 capture before the driving scan cells 520. A timing diagram depiction 630 in accordance with this embodiment is illustrated in FIG. 6C.

In the exemplary circuit 500, all driving scan cells 520 receive the same clock input A_CLK, and all driving scan cells 530 receive the same clock input B_CLK. However, it should be appreciated that it is not necessary for all the driving scan cells 520 to receive the same clock input A_CLK, nor is it necessary for all the driven scan cells 530 to receive the same clock B_CLK. Rather, the sequential transparency analysis process of the present invention is equally applicable to scan designs that include multiple skewed capture events.

Figure 7:
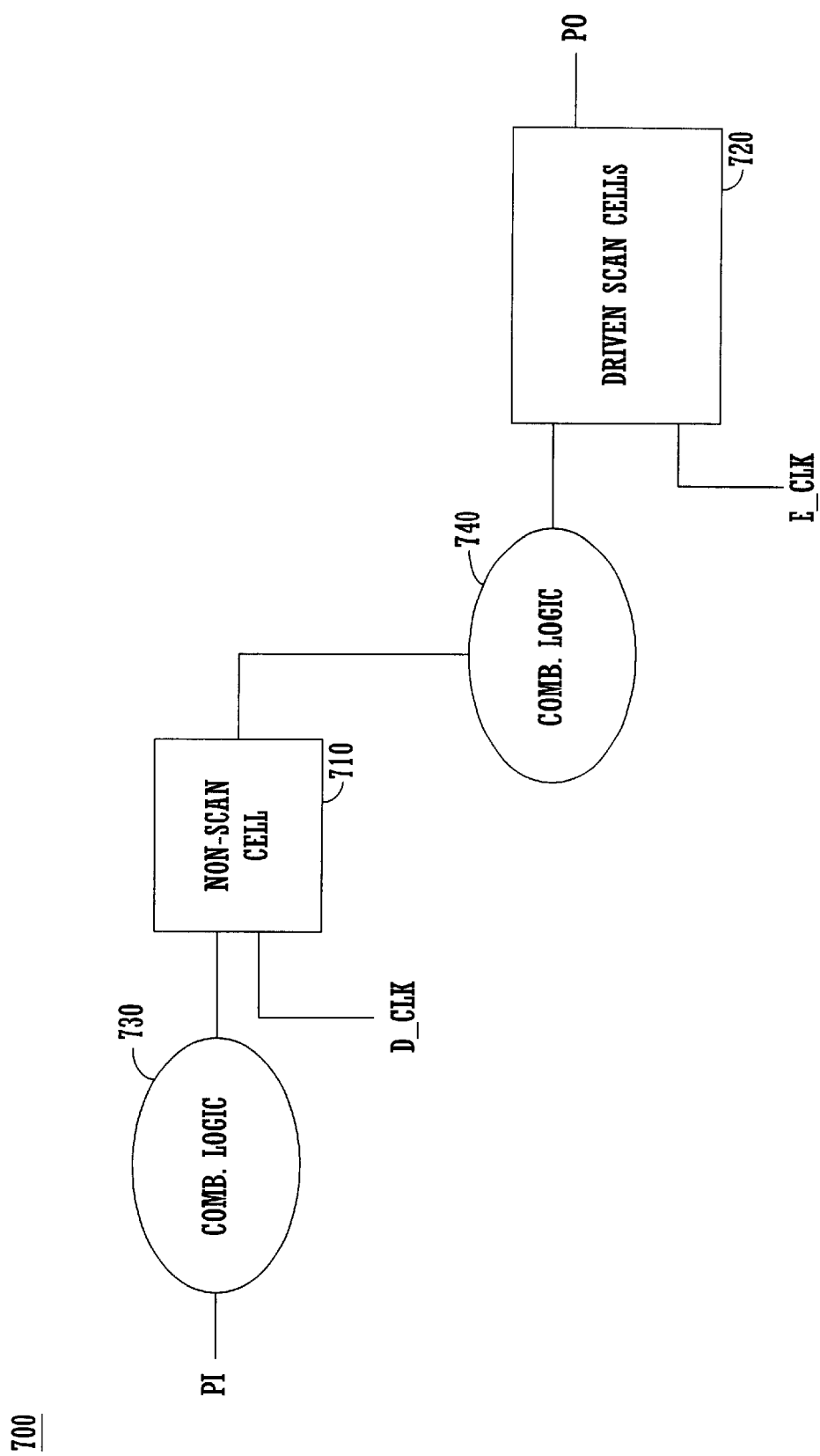
FIG. 7 is a block diagram illustrating an exemplary circuit including a non-scan cell according to one embodiment of the present invention.

FIG. 7 illustrates an exemplary circuit 700 including a non-scan cell 710 that may be characterized as sequentially transparent in accordance with one embodiment of the present invention. As illustrated, circuit 700 includes combinational logic circuit 730 coupled to the input of non-scan cell 710 and a number of driven scan cells 720 coupled to output of non-scan cell 710 via combinational logic circuit 740. In the present example, non-scan cell 710 is coupled to receive a clock input D_CLK and driven scan cells 720 are coupled to receive a clock input E_CLK. Combinational logic circuit 730 is coupled to receive primary input PI and the driven scan cells 720 are coupled to primary output PO.

Figure 8:
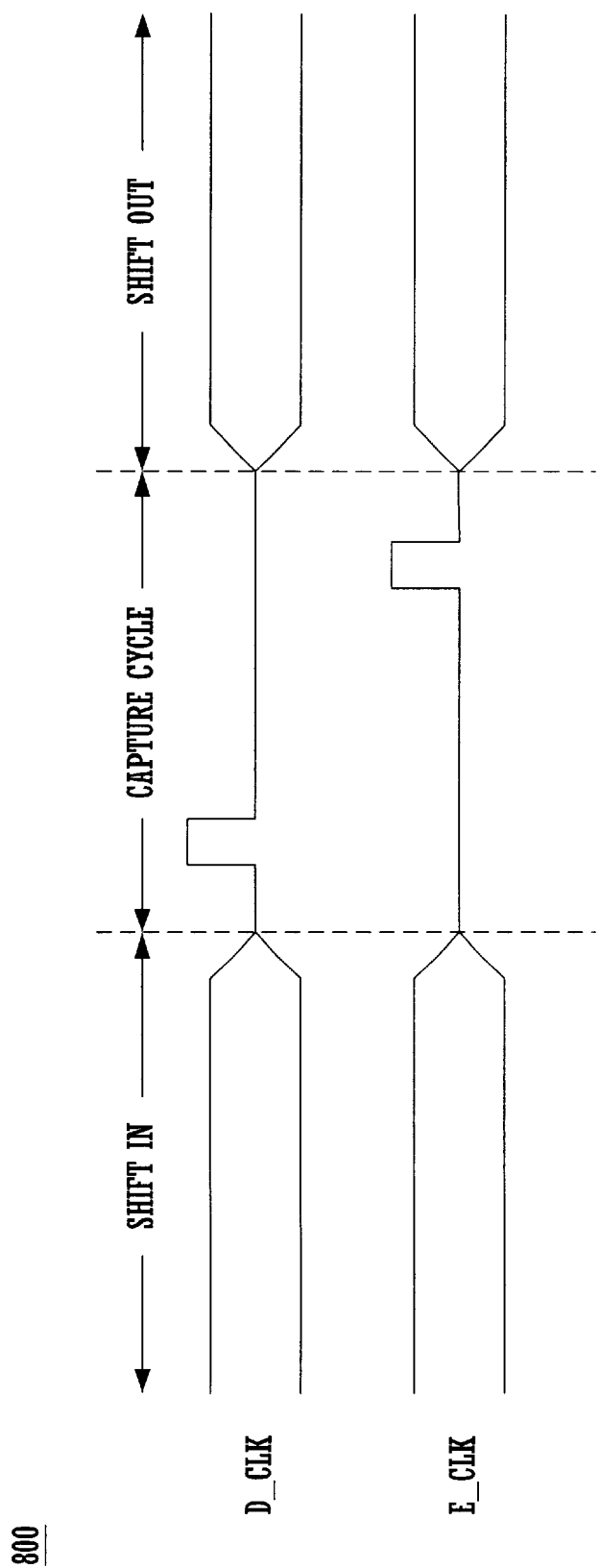
FIG. 8 shows a timing diagram depiction of a capture cycle in accordance with one embodiment of present invention.

According to this embodiment of the present invention, non-scan cell 710 exhibits sequential transparency behavior if the non-scan cell 710 captures before the driven scan cells 720 within the same capture cycle. A timing diagram depiction 800 in accordance with this embodiment is illustrated in FIG. 8. It should be noted that, although the driven scan cells 720 of FIG. 8 are coupled to receive the same clock input E_CLK, the sequential transparent analysis process of the present invention is equally applicable to scan designs having multiple skewed capture events.

Figure 9:
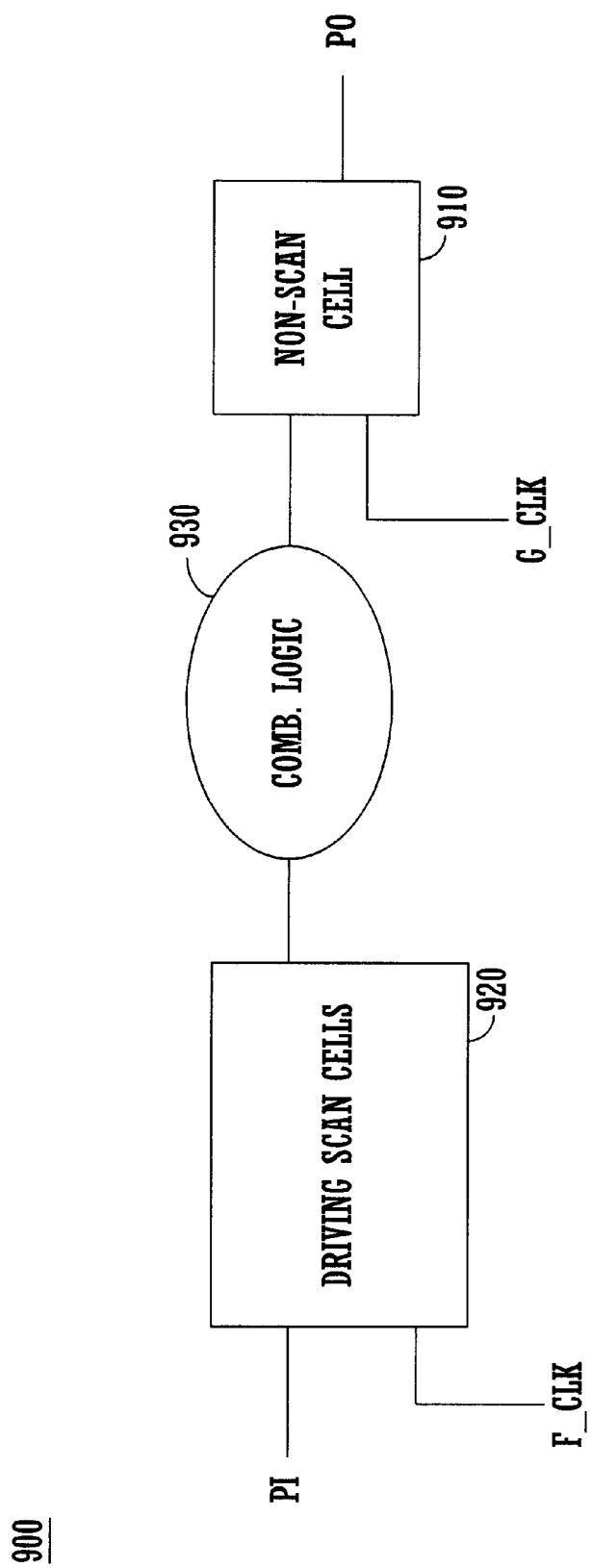
FIG. 9 is a block diagram illustrating an exemplary circuit including a non-scan cell according to one embodiment of the present invention.

FIG. 9 illustrates an exemplary circuit 900 including a non-scan cell 910 that may be characterized as sequentially transparent in accordance with one embodiment of the present invention. As illustrated, circuit 900 includes a number of driving scan cells 920 coupled to the input of non-scan cell 910 via combinational logic circuit 930. In the present example, non-scan cell 910 is coupled to receive a clock input G_CLK and driving scan cells 920 are coupled to receive a clock input F_CLK. Driving scan cells 920 are coupled to primary input PI and non-scan flop 910 is coupled to primary output PO.

Figure 10:
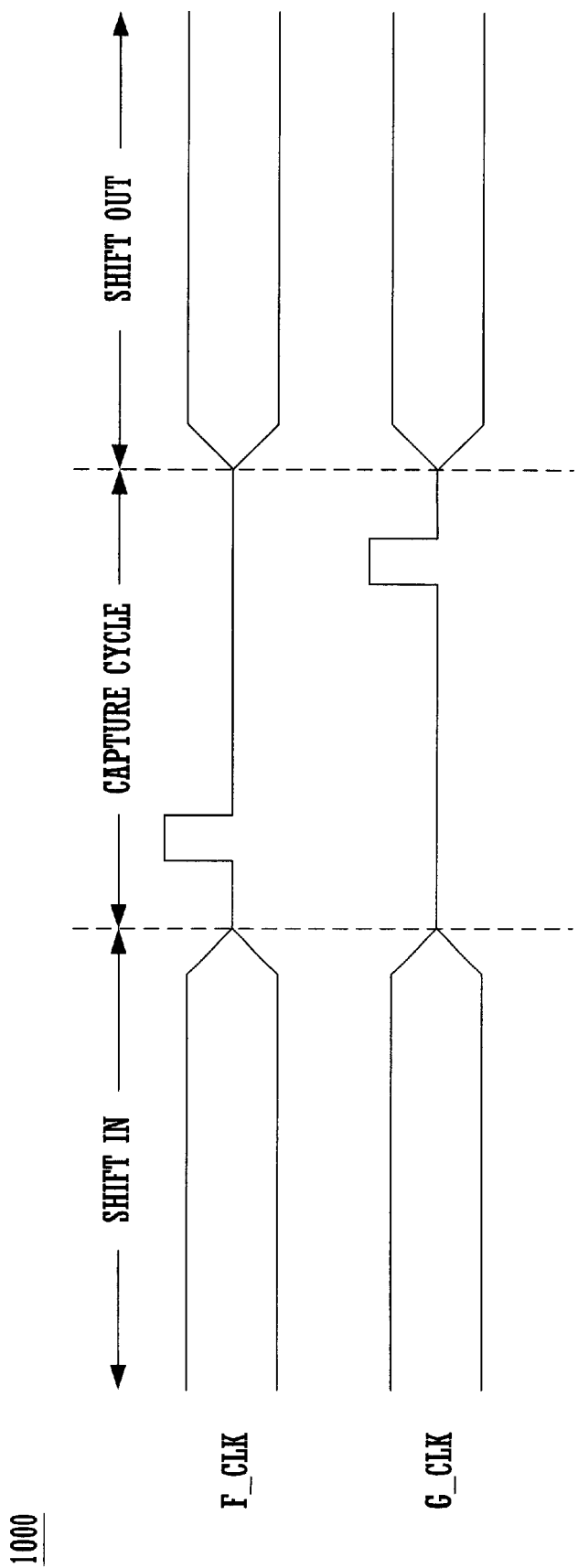
FIG. 10 shows a timing diagram depiction of a capture cycle in accordance with one embodiment of present invention.

According to the present invention, non-scan cell 910 exhibits sequential transparency behavior if the non-scan cell 910 captures after the driving scan cells 920 within the same capture cycle. A timing diagram depiction 1000 in accordance with this embodiment is illustrated in FIG. 10. It should be noted that, although the driving scan flops 1000 of FIG. 10 are coupled to receive the same clock input F_CLK, the sequential transparent analysis process of the present invention is equally applicable to scan designs having multiple skewed capture events.

Figure 11:
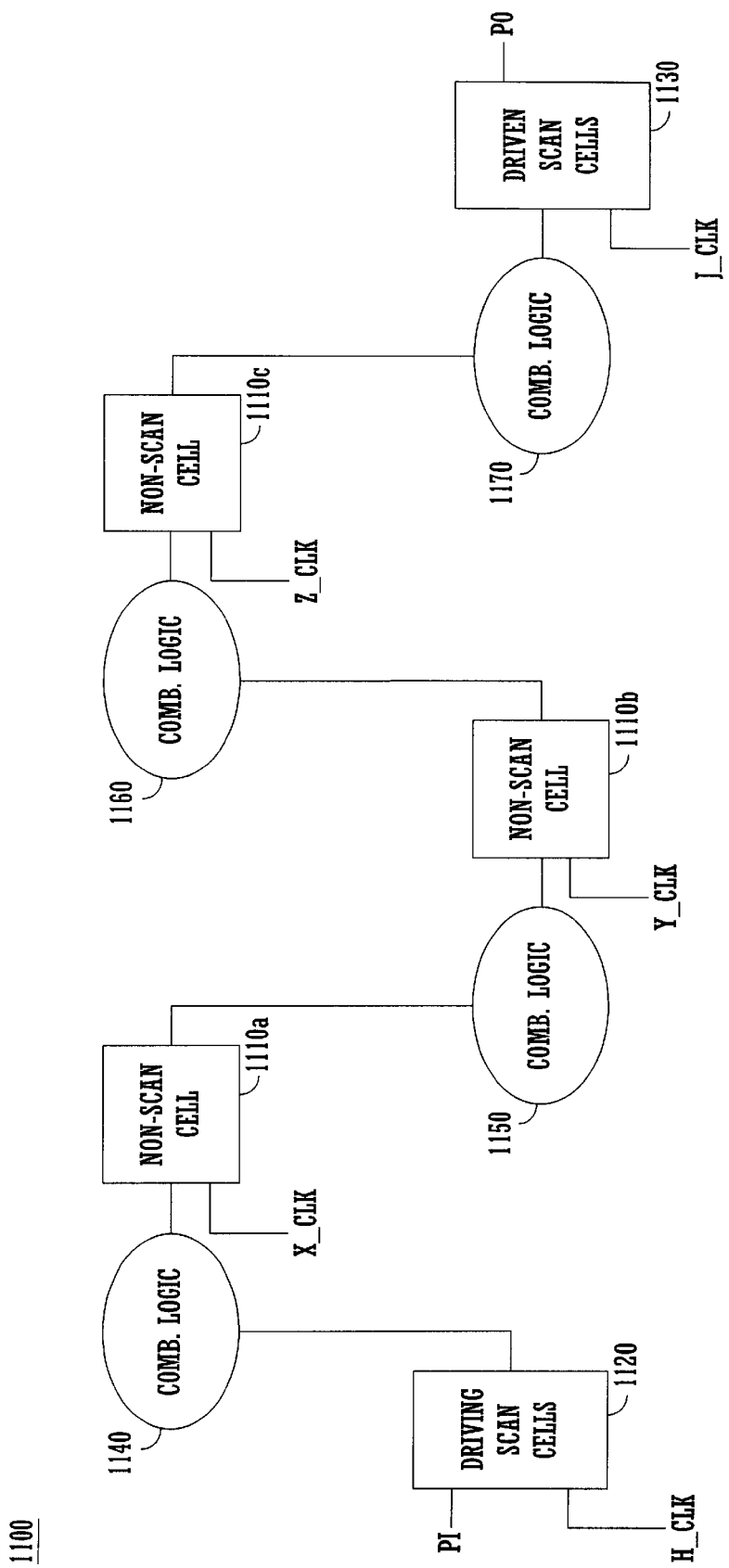
FIG. 11 is a block diagram illustrating an exemplary circuit including three non-scan cells in accordance with one embodiment of the present invention.

FIG. 11 illustrates an exemplary circuit 1100 including non-scan cells 1110a–1110c that may be characterized as sequentially transparent in accordance with one embodiment of the present invention. As illustrated, circuit 1100 includes a number of driving scan cells 1120 coupled to the input of the non-scan cell 1110a via combinational logic circuit 1140. Non-scan cell 1110a is coupled to non-scan cell 1110b via combinational logic circuit 1150. Non-scan cell 1110b is coupled to non-scan cell 1110c via combinational logic circuit 1160. Circuit 1100 also includes a number of driven scan cells 1130 coupled to the non-scan cell 1110c via combinational logic circuit 1170. In the present example, driving scan cells 1120 are coupled to receive a clock input H_CLK, non-scan cells 1110a–1110c is coupled to receive clock inputs X_CLK, Y_CLK and Z_CLK, respectively. Driven scan cells 1130 are coupled to receive a clock input J_CLK.

Figure 12:
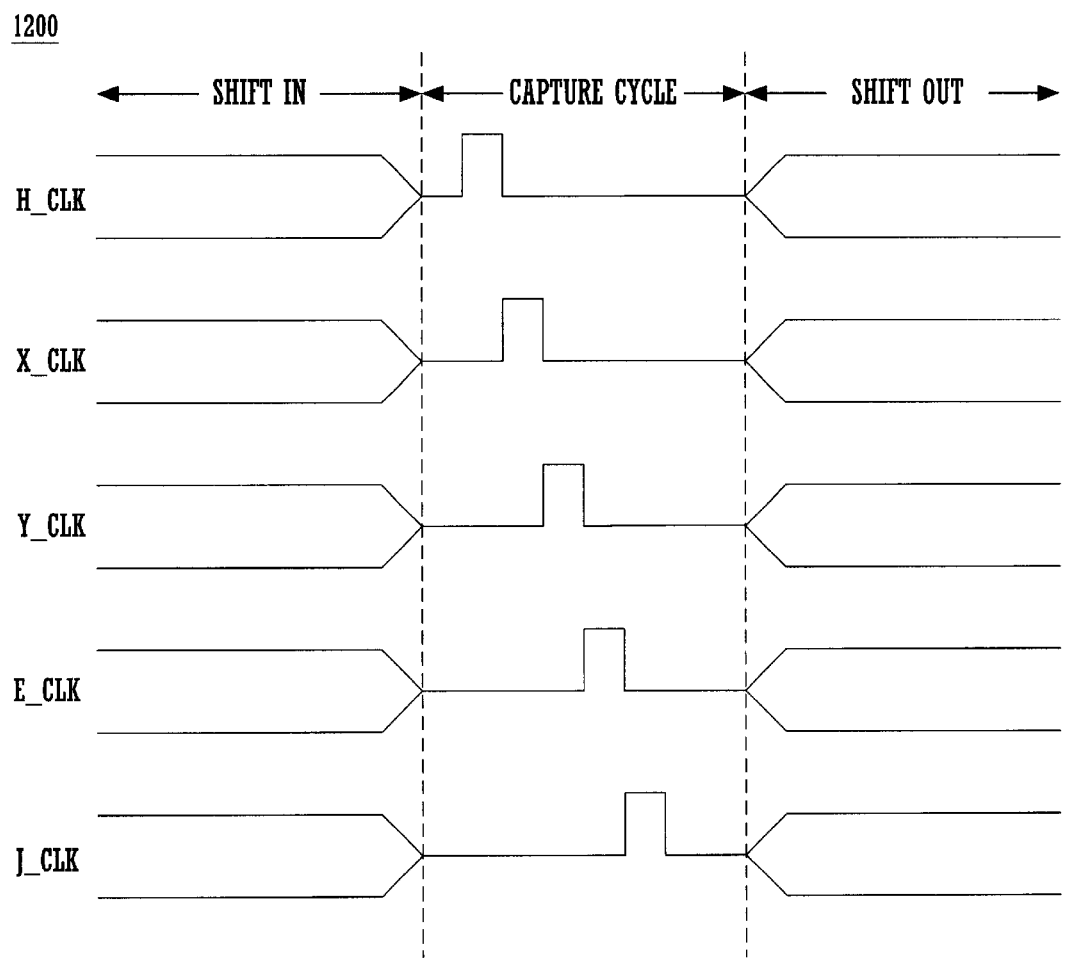
FIG. 12 shows a timing diagram depiction of a capture cycle in accordance with one embodiment of present invention.

According to the present invention, non-scan cells 1110a–1110c exhibit sequential transparency behavior if the non-scan cells 1110a–1110c capture after the driving scan cells 1120 and before the driven scan cells 1130, and if non-scan cell 1110a captures before non-scan cell 1110b, and if non-scan cell 1110b captures before non-scan cell 1110c, within the same capture cycle. A timing diagram depiction 1200 in accordance with this embodiment is illustrated in FIG. 12. The sequential transparent analysis process of the present invention is equally applicable to scan designs having multiple skewed capture events.

The present invention, a method and system for testing scan based sequential circuits that contain non-scan cells using combinational ATPG (Automatic Test Pattern Generation) techniques, has thus been disclosed. By using the sequential transparency analysis process of the present invention, non-scan cells that meet the requisite conditions are modeled as transparent during combinational ATPG simulation. In this manner, combinational ATPG simulation efficiency will be improved. In addition, test vectors thus generated have a larger fault coverage than those generated using prior art methods.

It should be appreciated that the present may be implemented as a stand-alone software process for use in conjunction with conventional combinational ATPG tools, or may be implemented as a portion of a combinational ATPG tool. While the present invention has been described in particular embodiments, it should also be appreciated that the present invention should not be construed as limited by such embodiments, but should be construed according to the below claims.

What is claimed is:

1. In an electronic design automation system, a method of automatically generating test vectors for use in testing integrated circuit devices comprising the computer implemented steps of:

a) receiving a netlist description of an integrated circuit device having a plurality of scan cells and a plurality of non-scan cells;

b) detecting sequential transparency behavior in a first group of non-scan cells of said plurality and generating characterization data indicative thereof; and c) based on said characterization data, performing combinational automatic test pattern generation analysis on said netlist description to generate test vectors for said integrated circuit device, wherein said step (c) includes the step of replacing said first group of non-scan cells with transparent logic models.

2. The method as recited in claim 1 further comprising the step of detecting sequential non-transparency behavior in a second group of non-scan cells of said plurality; and wherein said step (c) further includes the step of replacing said second group of non-scan cells with force-to-X models.

3. The method as recited in claim 1 wherein said step (b) comprises the steps of:

b1) identifying a respective non-scan cell of said plurality;

b2) identifying a first set of scan cells of said plurality that drive said respective non-scan cell;

b3) identifying a second set of scan cells of said plurality that are driven by said respective non-scan cell;

b4) characterizing said respective non-scan cell as sequentially transparent provided said respective non-scan cell captures data after said first set of scan cells and provided further said respective non-scan cell captures data before said second set of scan cells.

4. The method as recited in claim 1 wherein said step (b) comprises the steps of:

b1) identifying a respective non-scan cell of said plurality;

b2) identifying a first set of scan cells of said plurality that drive said respective non-scan cell;

b3) identifying a second set of scan cells of said plurality that are driven by said respective non-scan cell;

b4) characterizing said respective non-scan cell as sequentially transparent provided said respective non-scan cell captures data before said first set and second set of scan cells and provided further said first set and second set of scan cells capture data at a same time.

5. The method as recited in claim 1 wherein said step (b) comprises the steps of:

b1) identifying a respective non-scan cell of said plurality;

b2) identifying a first set of scan cells of said plurality that drive said respective non-scan cell;

b3) identifying a second set of scan cells of said plurality that are driven by said respective non-scan cell;

b4) characterizing said respective non-scan cell as sequentially transparent provided said respective non-scan cell captures data before said first set and second set of scan cells and provided further said first set of scan cells capture data after said second set of scan cells.

6. The method as recited in claim 1 wherein said step (b) comprises the steps of:

b1) identifying a respective non-scan cell of said plurality;

b2) identifying a set of scan cells of said plurality that are driven by said respective non-scan cell;

b3) characterizing said respective non-scan cell as sequentially transparent provided said respective non-scan cell captures data before said set of scan cells.

7. The method as recited in claim 1 wherein said step (b) comprises the steps of:

b1) identifying a respective non-scan cell of said plurality;

b2) identifying a set of scan cells of said plurality that drive said respective non-scan cell; and b3) characterizing said respective non-scan cell as sequentially transparent provided said respective non-scan cell captures data after said set of scan cells.

8. In an electronic design automation system, a method of generating test vectors for use in testing integrated circuit devices, said method comprising the computer implemented steps of:

a) receiving a netlist description of an integrated circuit device having a plurality of scan cells and a plurality of non-scan cells;

b) detecting sequential transparency behavior in a first group of non-scan cells of said plurality and generating characterization data indicative thereof; and c) based on said characterization data, performing combinational automatic test pattern generation analysis on said netlist description to generate test vectors for said integrated circuit device, wherein said step (c) includes the step of replacing said first group of non-scan cells with transparent logic models.

9. The method as recited in claim 8 further comprising the step of detecting sequential non-transparency behavior in a second group of non-scan cells of said plurality; and wherein said step (c) further includes the step of replacing said second group of non-scan cells with force-to-X models.

10. The method as recited in claim 8 wherein said step (b) comprises the steps of:

b1) identifying a respective non-scan cell of said plurality; identifying a first set of scan cells of said plurality that drive said respective non-scan cell;

b2) identifying a second set of scan cells of said plurality that are driven by said respective non-scan cell;

b3) characterizing said respective non-scan cell as sequentially transparent provided said respective non-scan cell captures data after said first set of scan cells and provided further said respective non-scan cell captures data before said second set of scan cells.

11. The method as recited in claim 8 wherein said step (b) comprises the steps of:

b1) identifying a respective non-scan cell of said plurality;

b2) identifying a first set of scan cells of said plurality that drive said respective non-scan cell;

b3) identifying a second set of scan cells of said plurality that are driven by said respective non-scan cell;

b4) characterizing said respective non-scan cell as sequentially transparent provided said respective non-scan cell captures data before said first set and second set of scan cells and provided further said first set and second set of scan cells capture data at a same time.

12. The method as recited in claim 8 wherein said step (b) comprises the steps of:

b1) identifying a respective non-scan cell of said plurality;

b2) identifying a first set of scan cells of said plurality that drive said respective non-scan cell;

b3) identifying a second set of scan cells of said plurality that are driven by said respective non-scan cell;

b4) characterizing said respective non-scan cell as sequentially transparent provided said respective non-scan cell captures data before said first set and second set of scan cells and provided further said first set of scan cells capture data after said second set of scan cells.

13. The method as recited in claim 8 wherein said step (b) comprises the steps of:

b1) identifying a respective non-scan cell of said plurality;

b2) identifying a set of scan cells of said plurality that are driven by said respective non-scan cell;

b3) characterizing said respective non-scan cell as sequentially transparent provided said respective non-scan cell captures data before said set of scan cells.

14. The method as recited in claim 8 wherein said step (b) comprises the steps of:

b1) identifying a respective non-scan cell of said plurality;

b2) identifying a set of scan cells of said plurality that drive said respective non-scan cell; and b3) characterizing said respective non-scan cell as sequentially transparent provided said respective non-scan cell captures data after said set of scan cells.

15. An electronic design automation (EDA) system comprising:

a computer system including a processor coupled to a computer readable memory via a bus, said computer readable memory containing computer readable software which, when executed by said computer system, causes said computer system to implement a method for generating test vectors for testing integrated circuit devices, said method comprising the steps of:

a) receiving a netlist description of an integrated circuit device having a plurality of scan cells and a plurality of non-scan cells;

b) detecting sequential transparency behavior in a first group of non-scan cells of said plurality and generating characterization data indicative thereof; and c) based on said characterization data, performing combinational automatic test pattern generation analysis on said netlist description to generate test vectors for said integrated circuit device, wherein said step (c) includes the step of replacing said first group of non-scan cells with transparent logic models.

16. The system as recited in claim 15 wherein said method further comprises the step of detecting sequential non-transparency behavior in a second group of non-scan cells of said plurality; and wherein said step (c) further includes the step of replacing said second group of non-scan cells with force-to-X models. non-scan cells of said plurality characterized as sequentially non-transparent are replaced with force-to-X models during said step (c).

17. The system as recited in claim 15 wherein said step (b) comprises the steps of:
   b1) identifying a respective non-scan cell of said plurality;
   b2) identifying a first set of scan cells of said plurality that drive said respective non-scan cell;
   b3) identifying a second set of scan cells of said plurality that are driven by said respective non-scan cell;
   b4) characterizing said respective non-scan cell as sequentially transparent provided said respective non-scan cell captures data after said first set of scan cells and provided further said respective non-scan cell captures data before said second set of scan cells.

18. The system as recited in claim 15 wherein said step (b) comprises the steps of:
   b1) identifying a respective non-scan cell of said plurality;
   b2) identifying a first set of scan cells of said plurality that drive said respective non-scan cell;
   b3) identifying a second set of scan cells of said plurality that are driven by said respective non-scan cell;
   b4) provided said respective non-scan cell captures data before said first set and second set of scan cells and provided further said first set and second set of scan cells capture data at a same time, characterizing said respective non-scan cell as sequentially transparent.

19. The system as recited in claim 15 wherein said step (b) comprises the steps of:
   b1) identifying a respective non-scan cell of said plurality;
   b2) identifying a first set of scan cells of said plurality that drive said respective non-scan cell;
   b3) identifying a second set of scan cells of said plurality that are driven by said respective non-scan cell;
   b4) characterizing said respective non-scan cell as sequentially transparent provided said respective non-scan cell captures data before said first set and second set of scan cells and provided further said first set of scan cells capture data after said second set of scan cells.

20. The system as recited in claim 15 wherein said step (b) comprises the steps of:
   b1) identifying a respective non-scan cell of said plurality;
   b2) identifying a set of scan cells of said plurality that are driven by said respective non-scan cell;
   b3) characterizing said respective non-scan cell as sequentially transparent provided said respective non-scan cell captures data before said set of scan cells.

21. The system as recited in claim 15 wherein said step (b) comprises the steps of:
   b1) identifying a respective non-scan cell of said plurality;
   b2) identifying a set of scan cells of said plurality that drive said respective non-scan cell; and
   b3) provided said respective non-scan cell captures data after said set of scan cells, characterizing said respective non-scan cell as sequentially transparent.

* * * * *